United States Patent [19]
Malladi

[11] Patent Number: 5,939,782
[45] Date of Patent: Aug. 17, 1999

[54] PACKAGE CONSTRUCTION FOR INTEGRATED CIRCUIT CHIP WITH BYPASS CAPACITOR

[75] Inventor: Devriprasad Malladi, Campbell, Calif.

[73] Assignee: Sun Microsystems, Inc., Mountain View, Calif.

[21] Appl. No.: 09/034,111

[22] Filed: Mar. 3, 1998

[51] Int. Cl.[6] .................................................. H01L 23/04
[52] U.S. Cl. .......................... 257/698; 257/700; 257/723; 257/778
[58] Field of Search .................................... 257/698, 700, 257/723, 724, 778, 725, 726, 727, 685, 686, 684, 532; 361/761, 764, 794

[56] References Cited

U.S. PATENT DOCUMENTS

| | | |
|---|---|---|
| 4,729,061 | 3/1988 | Brown . |
| 5,099,309 | 3/1992 | Kryzaniwsky . |
| 5,475,568 | 12/1995 | Umesato . |
| 5,498,906 | 3/1996 | Roane et al. ............................. 257/724 |
| 5,608,261 | 3/1997 | Bhattacharyya et al. . |
| 5,640,048 | 6/1997 | Selna ....................................... 257/738 |
| 5,875,100 | 2/1999 | Yamashita . |
| 5,877,550 | 2/1999 | Suzuki . |

OTHER PUBLICATIONS

John H. Lau (Ed.), Flip Chip Technologies, 1996, SMTnet, Portland, Maine.

DuPont Microcircuit Materials, Green Tape (tm), 1996, E.I. DuPont de Nemours and Co.

Flip Technologies, Bumping Service Design Guide, 1996, Flipchip Technologies, Phoenix, Arizona.

Patrick Thompson, Chip–Scale Packaging, Aug. 1997, IEEE Spectrum.

*Primary Examiner*—Sheila V. Clark
*Attorney, Agent, or Firm*—Fish & Richardson P.C.

[57] ABSTRACT

An integrated circuit assembly includes an integrated circuit die having a first face, a second face and a perimeter. The second face bears a plurality of electrical contacts. A substrate is coupled to the die and has a first surface and a second surface facing in a different direction from the first surface. The substrate has a plurality of layers between the first and the second surfaces, at least some of the layers having one or more electrical traces. A compartment extends from the second surface through a plurality of the layers and has surfaces defining an inner chamber including a device interface surface. A plurality of electrically conductive vias extend through a plurality of the layers and at least two non-intersecting vias extend from the first surface and are coupled to electrical contacts of the substrate and to the device interface surface. An auxiliary circuit device is located within the inner chamber and the auxiliary circuit device is electrically coupled to the non-intersecting vias and hence coupled to the die.

20 Claims, 2 Drawing Sheets

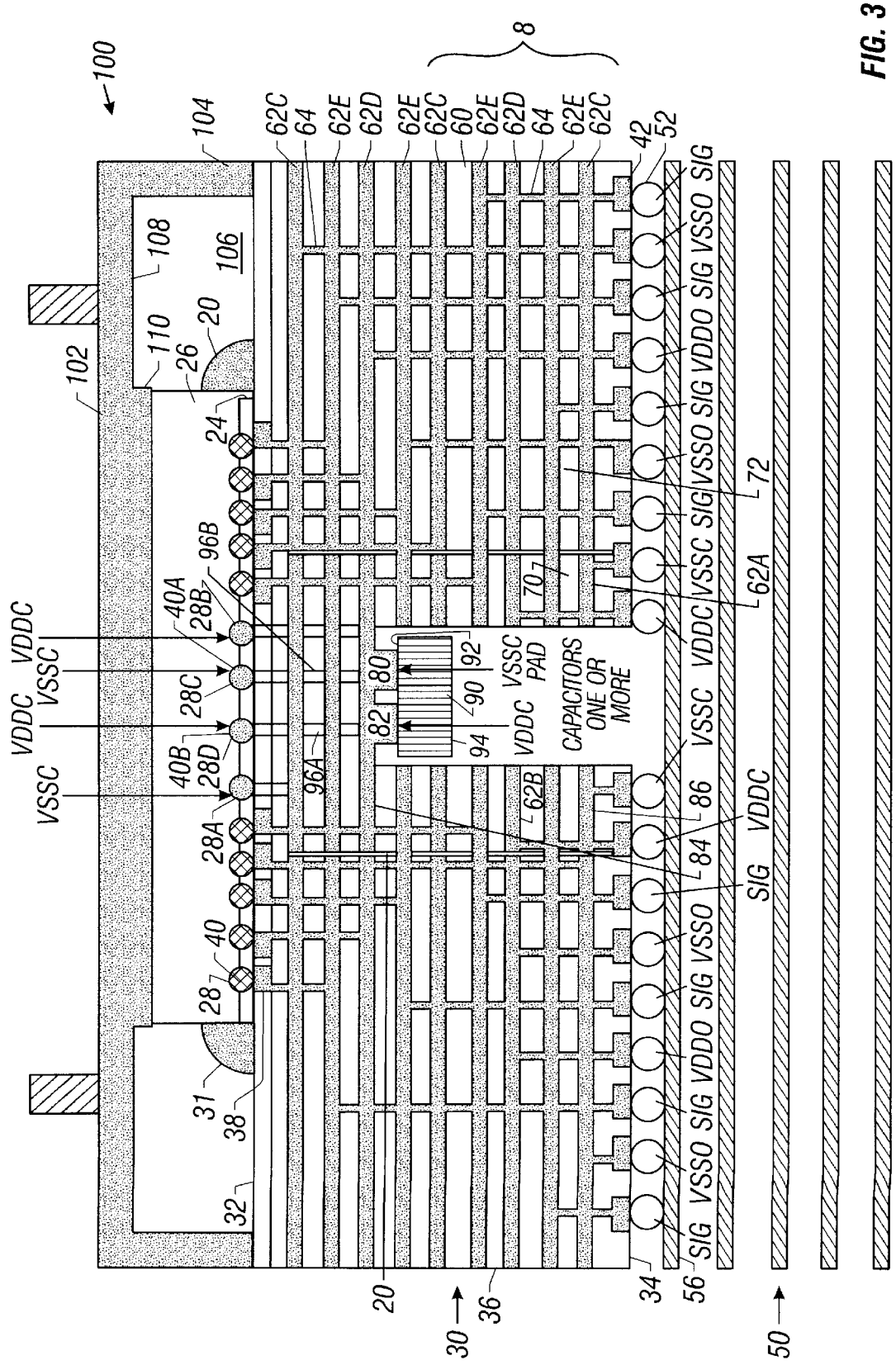

PACKAGE CONSTRUCTION FOR INTEGRATED CIRCUIT CHIP WITH BYPASS CAPACITOR

TECHNICAL FIELD

This invention relates to integrated circuit packaging, and more particularly to flip chip-type packaging systems.

BACKGROUND

A typical integrated circuit (IC) chip or die includes circuit elements formed on a semiconductor substrate. On one face, the die will have an array of electrical contacts for electrical communication (signal and power) with circuit elements external to the chip. Due to the small size of the die, the contacts are necessarily small and finely pitched. The size and pitch of the contacts make a direct assembly of chips within a larger component exceedingly difficult. Accordingly, one or more dies are frequently prepackaged in an IC package which provides a more convenient electrical interface with the outside world.

In common packing configurations, the die is placed on the upper surface of a package substrate with the contact-bearing face of the die facing upward. It is noted that the recited directions are relative and reflect the common orientation in which the components are assembled. Once assembled, the package may be used in a variety of orientations. The package substrate has a first array of contacts, typically located on the upper surface of the substrate, laterally beyond the area covered by the die. Each contact in this first array is generally associated with a contact on the die and is electrically connected to such associated contact by a technique such as wiring bonding or tape bonding.

The package substrate will typically include a second array of contacts, each typically in electrical communication with an associated contact of the first array. The second array is configured to provide a desired interface between the package and the outside world. The second array of contacts may take the form of wire leads or may take the form of or interface with a pin grid array (PGA), ball grid array (BGA) or other appropriate contact or connection system.

It is known to use a bypass capacitor in association with an IC die for purposes including the reduction of power transients. A bypass capacitor may be mounted in a variety of locations, including atop the die or atop the upper surface of the package substrate. Typically, one lead or pole of the capacitor is connected to the die's drain voltage $V_{DD}$ input while the other lead or pole is connected to the die's source voltage $V_{SS}$ input.

The flip chip package is known as an alternative to the more traditional face-up chip packaging. A flip chip package has a die which is flipped 180° relative to a die in a face-up package so that the die's contacts are facing the upper surface of the package substrate. The first contact array of the package substrate is substantially formed as a mirror image of the package array of contacts on the die and is located on the upper surface of the substrate immediately below the die. Associated contacts of the die and the first contact array of the package substrate may be electrically connected via an appropriate process such as bumping.

It is accordingly desirable that a package construction be provided which is particularly well suited to the provision of one or more bypass capacitors in a flip chip package.

SUMMARY

In one aspect, the invention is directed to an integrated circuit package assembly. The assembly includes an integrated circuit die having a first face, a second face and a perimeter. The second face bears a plurality of electrical contacts. A substrate is coupled to the die and has a first surface, and a second surface facing in a different direction from the first surface. The substrate has a plurality of layers between the first and the second surfaces, at least some of the layers having one or more electrical traces. A compartment extends from the second surface through a plurality of the layers and has surfaces defining an inner chamber including a device interface surface. A plurality of electrically conductive vias extend through a plurality of the layers. At least two non-intersecting vias extend from the first surface and are coupled to electrical contacts of the substrate and to the device interface surface. An auxiliary circuit device is located within the inner chamber. The auxiliary circuit device is electrically coupled to the non-intersecting vias and hence coupled to the die.

Implementations of the invention may include one or more of the following. The auxiliary device may be a stacked capacitor assembly. The auxiliary device vias may be located directly below the die. Each electrical contact of the die which is coupled to an associated electrical contact of the substrate may be coupled thereto by at least one bump. The assembly may include a plurality of contacts along the second surface of the substrate. The assembly may further include a printed circuit board and a ball grid array coupling the contacts along the second surface of the substrate to contacts along an adjacent surface of the printed circuit board. At least some of the substrate layers may substantially comprise ceramic material. The vias coupling the auxiliary circuit device to the die may include a first via coupled to a core source voltage contact of the die and a second via coupled to a core drain voltage contact of the die. The assembly may include a cap, covering the die and sealingly engaged to the substrate so as to define a sealed chamber containing the die. Encapsulation material may mechanically secure the die to the substrate. The substrate may have a rectangular shape and may have a shape matching a shape of the cavity.

In another aspect, the invention is directed to a substrate for carrying an integrated circuit die. The substrate has a first surface and a second surface facing in a different direction from the first surface. The substrate has a plurality of layers between the first surface and the second surface. A plurality of electrically conductive traces run along at least some of the layers. A plurality of electrically conductive vias extend through a group of the layers. A first plurality of contacts on the first surface of the substrate is configured to be electrically coupled to associated contacts of the die when the die is placed immediately adjacent to the first plurality of contacts. A compartment extends inward from the second surface of the substrate through a first plurality of the layers. The compartment has a device interface surface. At least two of the vias extend from the device interface surface to an associated at least two of the contacts of the first plurality of the contacts. There is a second plurality of electrical contacts on the second surface of the substrate. At least some of the contacts of the second plurality of contacts are electrically coupled to at least some of the contacts of the first plurality of contacts, at least in part by at least some of the vias.

The details of one or more embodiments of the invention are set forth in the accompanying drawings and the description below. Other features, objects, and advantages of the invention will be apparent from the description and drawings, and from the claims.

DESCRIPTION OF DRAWINGS

FIG. 3 is a schematic cross-sectional view of an IC package according to principles of the invention.

Like reference numbers and designations in the various drawings indicate like elements.

DETAILED DESCRIPTION

Figure 1:
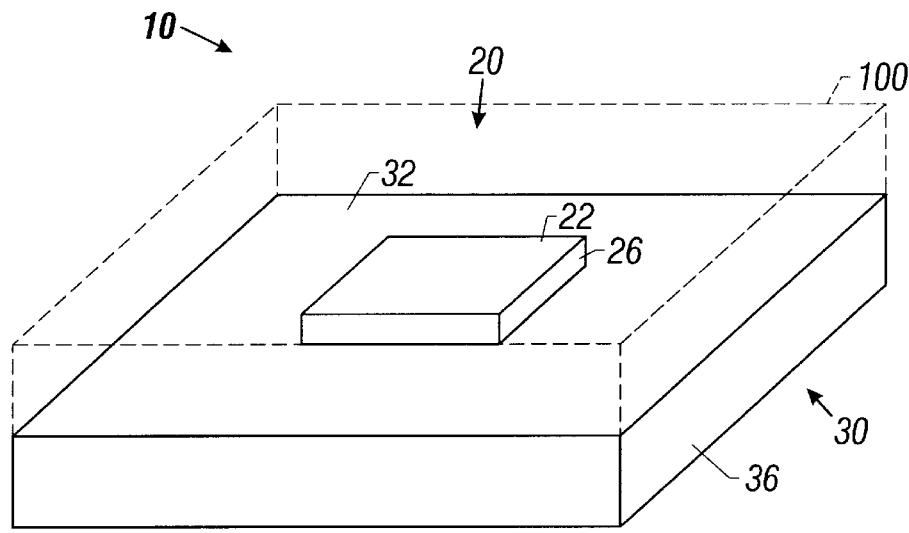
FIG. 1 is a schematic oblique view of an IC package according to principles of the invention.
Figure 2:
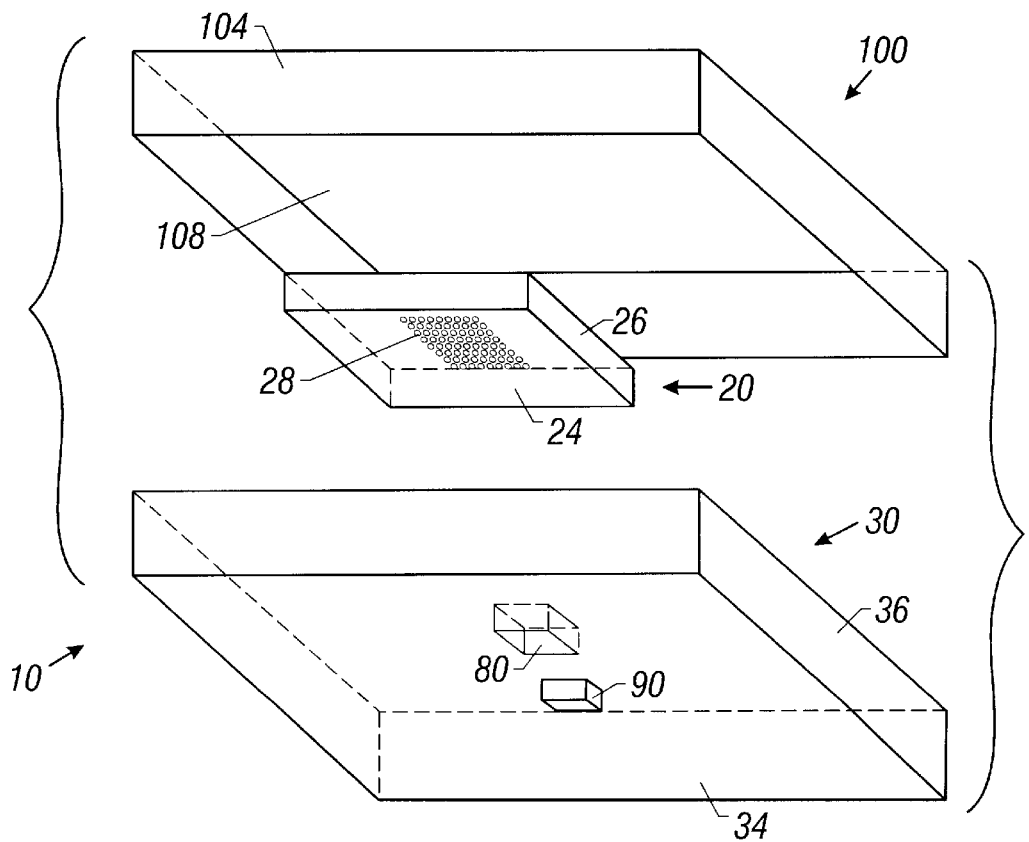
FIG. 2 is a schematic exploded oblique view of the package of FIG. 1.

FIGS. 1–3 show an integrated circuit (IC) package 10 containing an IC chip or die 20. Viewed in the illustrated flipped orientation of a flip chip package, the die has generally planar, substantially parallel upper and lower faces 22 and 24, respectively. A lateral edge or perimeter 26 extends vertically between the upper and lower faces 22 and 24. In the illustrated embodiment, the plan form of the die 20 is square, although other shapes are possible. The die may comprise various circuit components, may be formed of various materials and by various techniques and may represent devices for performing various functions.

The lower face 24 of the die bears a plurality of electrical contacts or pads 28 (including contacts 28A–28G described below) for providing electrical interface between the circuit elements of the die and a package substrate 30. An epoxy-type encapsulation material 31 (FIG. 3) secures the die to the substrate.

The substrate 30 provides an electrical interface between the die and the environment in which the package 10 is used. The substrate has a generally planar top 32 and bottom 34, parallel to the top 32. More generally, however, the substrate extends from a first surface to a second surface, which can be in any desired orientation. A perimeter 36 extends vertically between the top 32 and bottom 34. The substrate top 32 bears an array of electrical contacts 38 formed in a mirror image of the contacts 28 of the die 20. In an assembled configuration, the die 20 is positioned immediately above the substrate 30 in a close, parallel, spaced-apart relation. An array of solder bumps 40 may electrically connect each contact 28 of the die 20 with an associated contact 38 of the substrate positioned immediately therebelow.

The bottom 34 of the substrate bears an array of contacts 42 for providing electrical interface between the package and the outside world. The contacts 42 may be larger than and arrayed over a greater area than the contacts 38. The contacts 42 may be electrically connected to the external environment such as a printed circuit (PC) board 50. In an exemplary ball grid array (BGA) connection system, an array of solder balls 52 connect the contacts 42 with associated contacts 54 on the upper surface 56 of PC board 50. A variety of BGA systems exist and other connection systems, such as pin grid array (PGA) may also be used.

The substrate 30 is formed with a plurality of generally parallel, laterally extending, insulative layers 60. Each layer may have one or more conductive electrical traces 62 (including traces 62A–62E described below). A plurality of vertically extending, electrically conductive, vias 64 extend between the various layers. The vias in combination with the traces form discrete electrical paths between the contacts 42 and contacts 38.

A compartment 80 extends upward from its opening 82 at the bottom 34 of the substrate. The compartment 80 extends through a lower group 83 of the layers 60. A top 84 and a lateral wall 86 define the inner surface of the compartment 50. Wall 86 preferably extends vertically between the opening 82 and the top 84. An auxiliary circuit device, here a capacitor 90 is located in the compartment. The auxiliary circuit device is preferably a device that affects the operation of the IC. Capacitor 90 and has an upper surface 92 which is pressed against a device interface surface here, the top 84 of the compartment and electrically-connected thereto. A lower surface 94 is preferably recessed relative to the bottom 34 of the substrate. A pair of conductive vias 96A and 96B extend through the remaining substrate layers above the compartment. This connects the capacitor 90 to a pair of core bumps 40A and 40B and associated core source voltage ($V_{SSC}$) and drain voltage ($V_{DDC}$) contacts 28C and 28D. The capacitor when so connected, can serve as a bypass capacitor. In the illustrated embodiment, the compartment 80 and capacitor 90 are located centrally below the die 20. The capacitor may be chosen from a variety of types and may comprise a stacked capacitor assembly. The device package is preferably rectangular to match the preferred inner shape of compartment 80.

The package further comprises a cap 100 having a top 102 and a perimeter lip 104 depending from the top. The lip 104 sealingly engages the top 32 of the substrate 30 to define a sealed chamber 106 containing the die. The underside 108 of the top may form a pressing surface engaging the upper face 22 of the die, either directly or by way of a layer 110 of epoxy.

In the illustrated embodiment, the source and drain voltages for the central core processing functions of the die may be separated from the source and drain voltages for the input/output (I/O) functions of the die. Core contacts including contacts 28A and 28C can be used for input of the core source voltage ($V_{SSC}$), and contacts 28B and 28D can be used for input of the core drain voltage ($V_{DDC}$). An outer group of the contacts 28 may include contacts 28E for I/O source voltage ($V_{SSO}$), contacts 28F for I/O drain voltage ($V_{DDO}$), and contacts 28G for various I/O signals. Similarly, the traces 62 on layers 60 may include $V_{SSC}$ traces 62A, $V_{DDC}$ traces 62B, $V_{SSO}$ traces 62C, $V_{DDO}$ traces 62D and signal traces 62E.

A core section 70 of the substrate 30 may be separated from an outer section 72 of the substrate 30 by a gap 120 which may extend through various of the layers 60 and can facilitate the presence of different traces 62 on a given layer 60. By way of example, this facilitates the presence of a $V_{SSC}$ trace 62A on the core section of a layer 60 with a $V_{SSO}$ trace 62C on the outer section of that layer. Similarly, $V_{DDC}$ and $V_{DDO}$ traces 62B and 62D may be combined on a single layer 60. This facilitates a more vertically compact substrate 30 than would be otherwise obtained. The substrate 30 may be formed of a ceramic.

The location of the capacitor 90 in the compartment 80 helps minimize the length of the electrical paths between the capacitor and the die relative to configurations where the capacitor is more remote from the $V_{SSC}$ and $V_{DDC}$ contacts of the die. For example, a bypass capacitor located on the upper surface 32 of the substrate 30 would require electrical paths from the die that descend down through the substrate from the die and also extend laterally through the substrate and then ascend to the capacitor located aside the substrate. The high inductance posed by such a path degrades the performance of the bypass capacitor.

One or more embodiments of the present invention have been described. Nevertheless, it will be understood that various modifications may be made without departing from the spirit and scope of the invention. For example, multiple capacitors in a single compartment or in multiple compartments may be provided and multiple dies may be placed on a single substrate. The type, properties and design of the particular dies may influence the location of the compartment(s), the selection of the capacitor(s) and other aspects of the implementation. The auxiliary devices could be other devices including indications, R-C timing circuits, calibration trimming circuits, and others. A variety of materials, component types and construction techniques may be used. Accordingly, other embodiments are within the scope of the following claims.

What is claimed is:

1. An integrated circuit package assembly, comprising:

(a) an integrated circuit die, having a first face, a second face and a perimeter, the second face bearing a plurality of first electrical contacts;

(b) a substrate defined by a plurality of layers and a plurality of electrically conductive vias extending through the plurality of layers, and including a plurality of second electrical contacts disposed along a fist surface thereof matingly coupled to the plurality of first electrical contacts, the plurality of layers extending below the first surface of the substrate, at least some of the layers having one or more electrical traces, the substrate further including a compartment extending inwardly from a second surface thereof, through a plurality of the layers and having surfaces defining an inner chamber including a device intake surface having third electrical contacts, the electrically conductive vias including at least two non-intersecting vias extending from fourth electrical contacts on the first surface of the substrate to the third electrical contacts of said device interface surface; and (c) an auxiliary circuit device, located within said inner chamber defined by the compartment, the auxiliary circuit device being electrically coupled to said at least two non-intersecting vias and to the die by said at least two non-intersecting vias.

2. The assembly of claim 1, wherein the auxiliary circuit device is a stacked capacitor assembly.

3. The assembly of claim 1, wherein the auxiliary circuit device is located directly below the die.

4. The assembly of claim 3, further comprising a plurality of bumps and wherein each first electrical contact of the die which is coupled to an associated second electrical contact of the substrate is coupled by at least one bump of said plurality of bumps.

5. The assembly of claim 4, further comprising a plurality of contacts along the second surface of the substrate.

6. The assembly of claim 5, further comprising:

a printed circuit board having a surface adjacent to the substrate and a plurality of contacts along the surface; and a ball grid array coupling the plurality contacts along the second surface of the substrate to the plurality of contacts along the surface of the printed circuit board.

7. The assembly of claim 3, wherein at least some of the substrate layers substantially comprise a ceramic material.

8. The assembly of claim 3, wherein the at least two said vias coupling the auxiliary circuit device to the die include a first via coupled to a core source voltage contact of the die and a second via coupled to a core drain voltage contact of the die.

9. The assembly of claim 3, further comprising a cap, covering the die and sealingly engaged to the substrate so as to define a sealed chamber containing the die.

10. The assembly of claim 9, further comprising encapsulation material mechanically securing the die to the substrate.

11. The assembly of claim 1, wherein the auxiliary circuit device is a capacitor.

12. The assembly of claim 1, having an overall rectangular shape.

13. The assembly of claim 1, wherein the substrate has a substrate shape and the cavity has a cavity shape, generally similar to the substrate shape.

14. The assembly of claim 1, wherein the first surface of the substrate is a substrate top and the second surface of the substrate is a substrate bottom.

15. A substrate for carrying an integrated circuit die defined by a plurality of layers and a plurality of electrically conductive vias extending through the plurality of layers, and including a plurality of first surface electrical contacts disposed along a first surface thereof for being matingly vertically juxtaposed to the integrated circuit die, the plurality of layers extending below the first surface of the substrate, a plurality of electrically conductive traces, running along at least some layers of the plurality of layers, the plurality of electrically conductive vias extending through at least some layers of the plurality of layers, the first surface electrical contacts configured to be electrically coupled to associated contacts of the die when the die is placed immediately adjacent the first surface electrical contacts, the substrate including:

a compartment extending inward from a second surface of the substrate, through a plurality of the layers, the compartment having surfaces defining an inner chamber including a device interface surface having device interface electrical contacts, the electrically conductive vias including at least two vias extending from ones of said first surface electrical contacts on the first surface of the substrate to associated ones of the device in electrical contacts on the device interface surface; and a plurality of surface electrical contacts on a surface of the substrate other than the first surface of the substrate, at least some of the contacts of the plurality of surface electrical contacts being electrically coupled to at least some of the first surface electrical contacts at least in part by at least some of the vias.

16. The substrate of claim 15, wherein at least some of the layers substantially comprise a ceramic material.

17. The substrate of claim 16, having a generally rectangular shape.

18. The substrate of claim 15, wherein said device interface surface is adapted to couple to an auxiliary circuit device positionable within the inner chamber defined by the compartment in electrical communication with the at least two vias.

19. The substrate of claim 18, wherein the auxiliary circuit device is of the stacked capacitor assembly type.

20. The substrate of claim 19, wherein the inner chamber defined by the compartment is vertically aligned below the position the die is intended to be matingly vertically juxtaposed relative to said substrate.

* * * * *